United States Patent
Iizuka et al.

(10) Patent No.: US 10,950,278 B2
(45) Date of Patent: Mar. 16, 2021

(54) NONVOLATILE MEMORY DEVICE INCLUDING MEMORY ELEMENT IN EQUAL CROSS-SECTIONAL AREA OF WORD LINES AND BIT LINES

(71) Applicant: TOSHIBA MEMORY CORPORATION, Tokyo (JP)

(72) Inventors: Takahiko Iizuka, Yokohama Kanagawa (JP); Daisaburo Takashima, Yokohama Kanagawa (JP); Ryu Ogiwara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/570,507

(22) Filed: Sep. 13, 2019

(65) Prior Publication Data
US 2020/0302975 A1    Sep. 24, 2020

(30) Foreign Application Priority Data

Mar. 20, 2019  (JP) .............................. JP2019-053816

(51) Int. Cl.
| | | |
|---|---|---|
| *G11C 5/06* | (2006.01) | |
| *G11C 13/00* | (2006.01) | |
| *G11C 8/14* | (2006.01) | |
| *G11C 7/18* | (2006.01) | |

(52) U.S. Cl.
CPC .............. *G11C 5/063* (2013.01); *G11C 7/18* (2013.01); *G11C 8/14* (2013.01); *G11C 13/0026* (2013.01); *G11C 13/0028* (2013.01)

(58) Field of Classification Search
CPC .. G11C 5/063; G11C 7/18; G11C 8/14; G11C 13/0026; G11C 13/0028
USPC .......................................................... 365/63
See application file for complete search history.

(56) References Cited

U.S. PATENT DOCUMENTS

| | | | |
|---|---|---|---|
| 9,257,484 B2 | 2/2016 | Okajima | |
| 10,032,486 B2 | 7/2018 | Miyazaki | |
| 10,128,316 B2 | 11/2018 | Tanaka et al. | |
| 10,141,374 B2 | 11/2018 | Murooka | |
| 10,541,011 B1* | 1/2020 | Hong | .................. G11C 13/0026 |
| 2009/0230435 A1* | 9/2009 | Maejima | .................. H01L 45/06 |
| | | | 257/208 |
| 2010/0128512 A1 | 5/2010 | Ohnishi | |
| 2011/0242872 A1* | 10/2011 | Hanzawa | .................. G11C 7/18 |
| | | | 365/51 |

(Continued)

FOREIGN PATENT DOCUMENTS

| | | |
|---|---|---|
| JP | 2006-303150 A | 11/2006 |
| JP | 2007-129041 A | 5/2007 |
| JP | 2014-150234 A | 8/2014 |

*Primary Examiner* — Sung Il Cho
(74) *Attorney, Agent, or Firm* — Foley & Lardner LLP

(57) ABSTRACT

According to one embodiment, a nonvolatile memory device includes first and second word lines, first and second bit lines, memory cells each including a resistance change memory element, a global word line including a first global word line portion including a first end portion, a global bit line including a first global bit line portion including a second end portion. The first and second word lines and the first global bit line portion have a first line width and a first line thickness, the first and second bit lines and the first global word line portion have a second line width and a second line thickness.

14 Claims, 8 Drawing Sheets

(56) References Cited

U.S. PATENT DOCUMENTS

| | | | |
|---|---|---|---|
| 2012/0147644 A1* | 6/2012 | Scheuerlein | H01L 45/165 365/51 |
| 2013/0148400 A1* | 6/2013 | Murooka | H01L 27/249 365/63 |
| 2014/0254242 A1* | 9/2014 | Siau | H01L 45/06 365/148 |
| 2015/0146474 A1* | 5/2015 | Murooka | G11C 13/0002 365/148 |
| 2016/0267968 A1* | 9/2016 | Murooka | H01L 45/04 |
| 2016/0372194 A1* | 12/2016 | Ly-Gagnon | G11C 13/004 |
| 2017/0110197 A1* | 4/2017 | Park | G11C 16/10 |

* cited by examiner

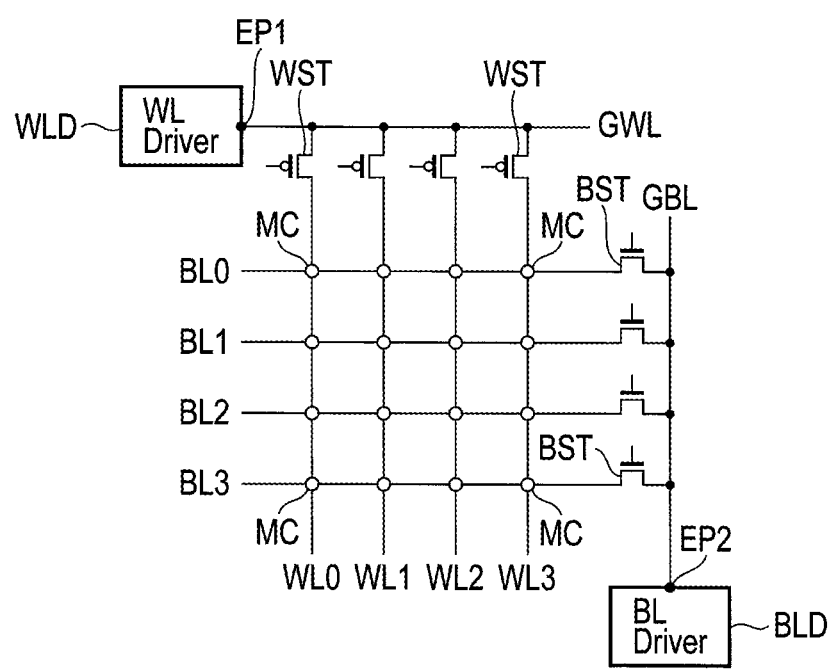
F I G. 1

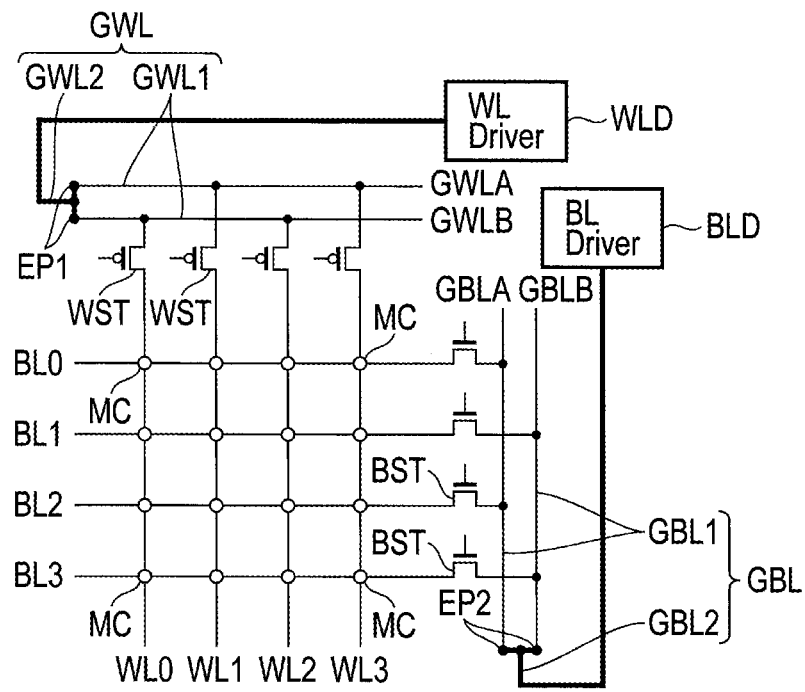
F I G. 8
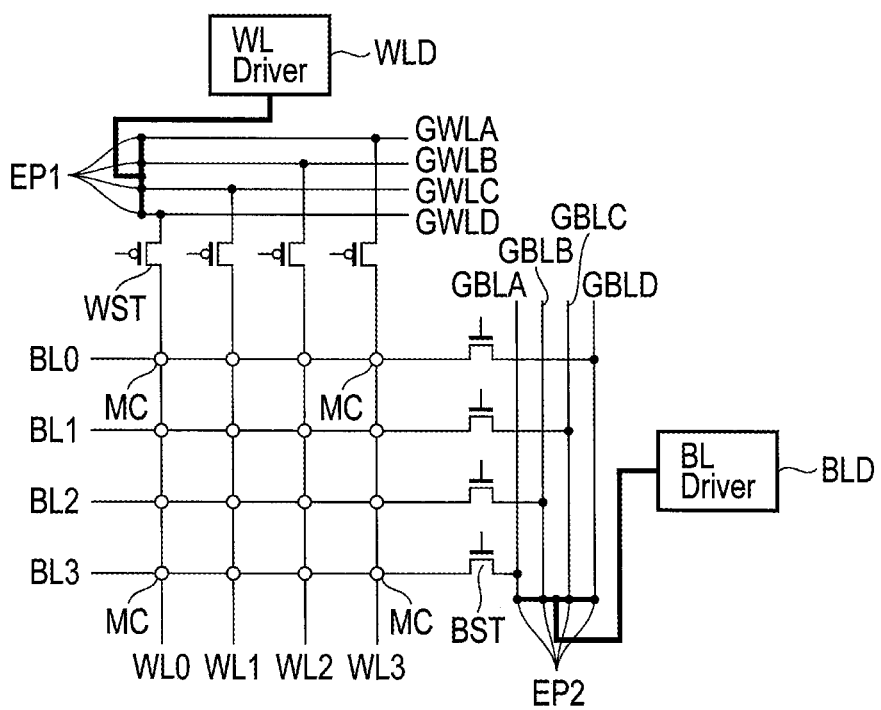
F I G. 9

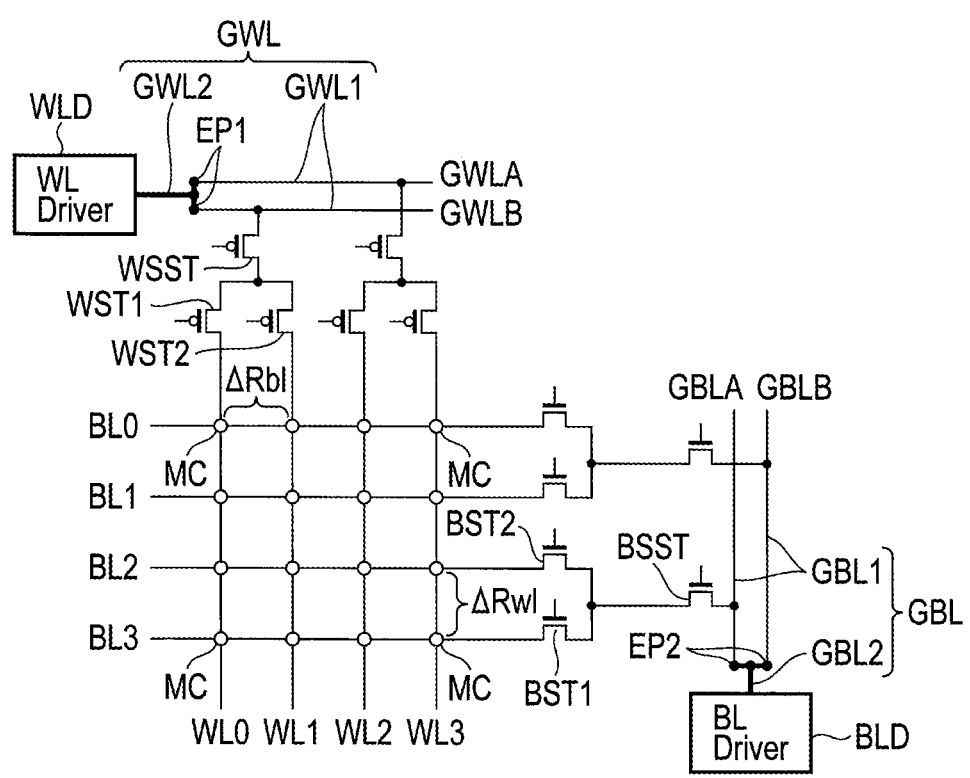
F I G. 10

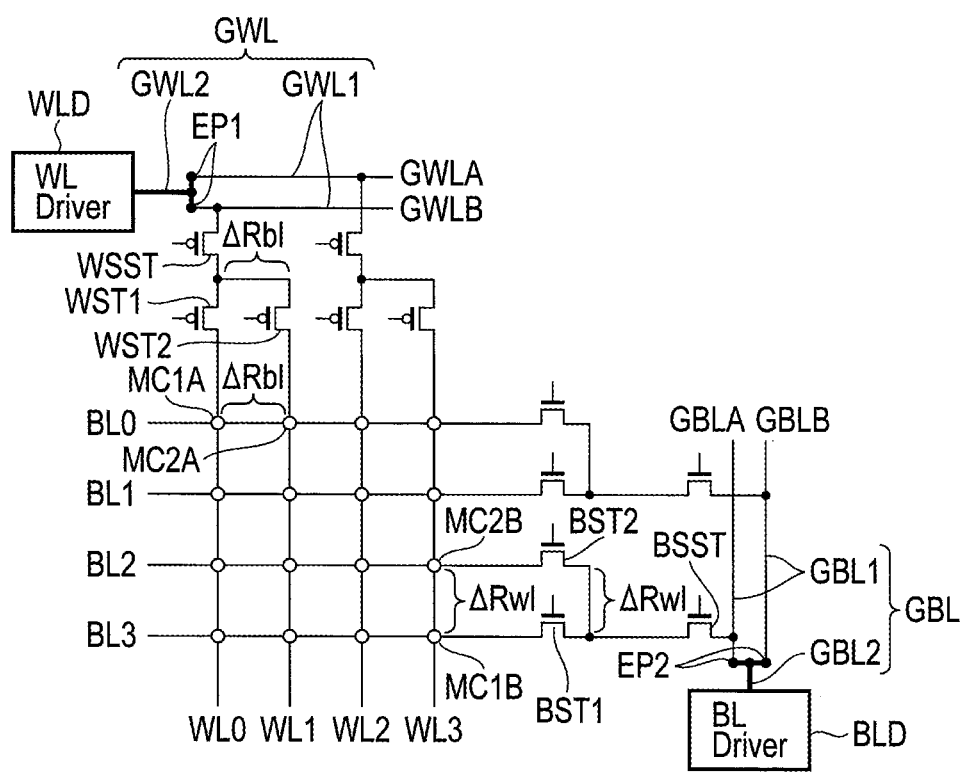
F I G. 11

NONVOLATILE MEMORY DEVICE INCLUDING MEMORY ELEMENT IN EQUAL CROSS-SECTIONAL AREA OF WORD LINES AND BIT LINES

CROSS-REFERENCE TO RELATED APPLICATIONS

This application is based upon and claims the benefit of priority from Japanese Patent Application No. 2019-053816, filed Mar. 20, 2019, the entire contents of which are incorporated herein by reference.

FIELD

Embodiments described herein relate generally to a nonvolatile memory device.

BACKGROUND

Nonvolatile memory devices in which memory cells each including a resistance change memory element are connected between word lines and bit lines have been proposed.

In the above nonvolatile memory devices, it is desirable that a voltage which does not depend on the positions of the memory cells be applied to a selected memory cell when a write or a read is executed to or from the selected memory cell.

However, conventionally, the voltage which does not depend on the positions of the memory cells has not necessarily been applied to the selected memory cell.

BRIEF DESCRIPTION OF THE DRAWINGS

FIG. 1 is an explanation diagram schematically showing the structure of a nonvolatile memory device according to an embodiment.

FIG. 8 is an explanation diagram schematically showing the structure of a fifth modified example of the nonvolatile memory device according to the embodiment.

FIG. 9 is an explanation diagram schematically showing the structure of a sixth modified example of the nonvolatile memory device according to the embodiment.

FIG. 10 is an explanation diagram schematically showing the structure of a seventh modified example of the nonvolatile memory device according to the embodiment.

FIG. 11 is an explanation diagram schematically showing the structure of an eighth modified example of the nonvolatile memory device according to the embodiment.

DETAILED DESCRIPTION

In general, according to one embodiment, a nonvolatile memory device includes: a first word line extending in a first direction; a second word line extending in the first direction; a first bit line extending in a second direction intersecting the first direction; a second bit line extending in the second direction; memory cells connected between the first word line and the first bit line, between the first word line and the second bit line, between the second word line and the first bit line, and between the second word line and the second bit line, respectively, and each including a resistance change memory element; a global word line extending in the second direction; a global bit line extending in the first direction; a first word line select circuit connected between the first word line and the global word line; a second word line select circuit connected between the second word line and the global word line; a first bit line select circuit connected between the first bit line and the global bit line; a second bit line select circuit connected between the second bit line and the global bit line; a word line driver connected to the global word line, and supplying a first signal to the first word line selected by the first word line select circuit and to the second word line selected by the second word line select circuit; and a bit line driver connected to the global bit line, and supplying a second signal to the first bit line selected by the first bit line select circuit and to the second bit line selected by the second bit line select circuit, wherein the first word line and the second word line both have a first line width and a first line thickness, the first bit line and the second bit line both have a second line width and a second line thickness, the global word line includes a first global word line portion having the second line width and the second line thickness, the global bit line includes a first global bit line portion having the first line width and the first line thickness, the first global word line portion has a first end portion to which a signal from the word line driver is input, the first global bit line portion has a second end portion to which a signal from the bit line driver is input, and the first word line is nearer than the second word line with respect to the first end portion, the second word line is nearer than the first word line with respect to the second end portion, the first bit line is nearer than the second bit line with respect to the first end portion, and the second bit line is nearer than the first bit line with respect to the second end portion.

Embodiments will be described hereinafter with reference to the accompanying drawings.

Figure 2:
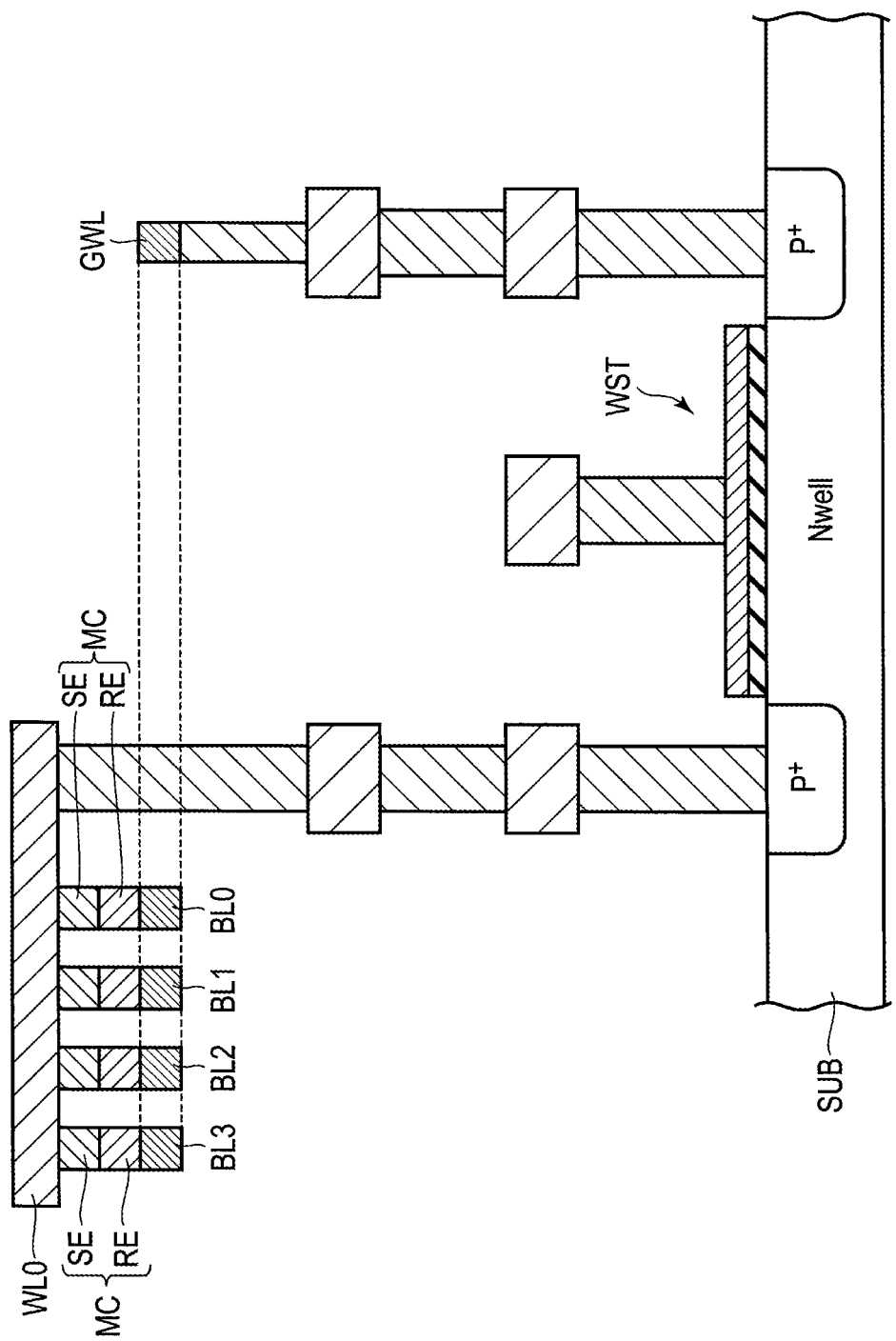
FIG. 2 is a cross-sectional view schematically showing the structure of the nonvolatile memory device according to the embodiment.
Figure 3:
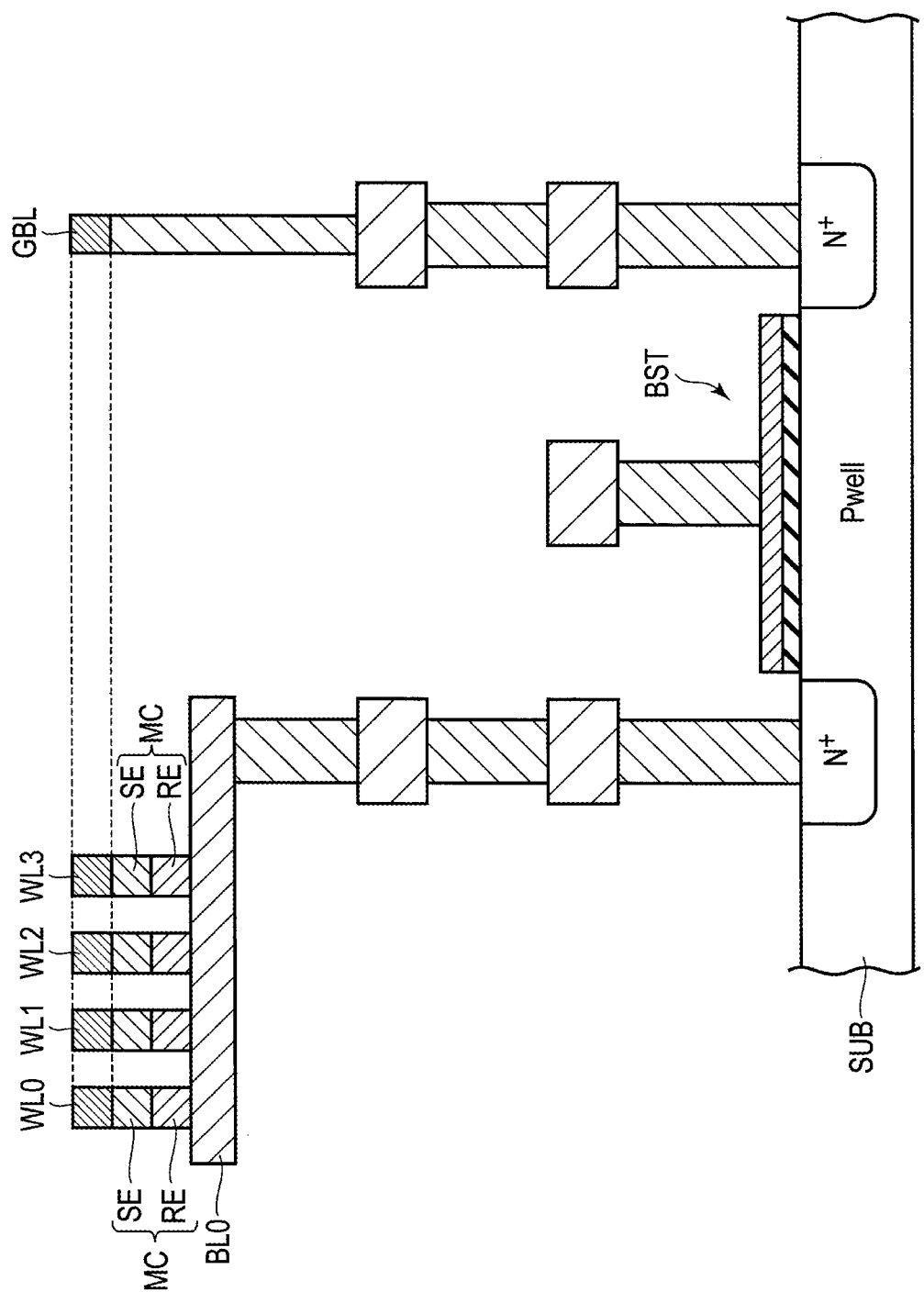
FIG. 3 is a cross-sectional view schematically showing the structure of the nonvolatile memory device according to the embodiment.

FIG. 1 is an explanation diagram schematically showing the structure of a nonvolatile memory device according to an embodiment. FIG. 2 is a cross-sectional view (along the direction of word lines) schematically showing the structure of the nonvolatile memory device according to the embodiment. FIG. 3 is a cross-sectional view (along the direction of bit lines) schematically showing the structure of the nonvolatile memory device according to the embodiment.

The nonvolatile memory device according to the present embodiment comprises word lines WL (WL0 to WL3), bit lines BL (BL0 to BL3), memory cells MC, a global word line GWL, a global bit line GBL, word line select transistors (word line select circuits) WST, bit line select transistors (bit line select circuits) BST, a word line driver WLD, and a bit line driver BLD.

The word lines WL extend in a first direction, and the bit lines BL extend in a second direction perpendicular to the first direction and intersect the word lines WL.

The memory cells MC are connected between the word lines WL and the bit lines BL, and include resistance change memory elements RE and selector elements SE connected to the resistance change memory elements RE in series as shown in FIG. 2 and FIG. 3. The resistance change memory elements RE and the selector elements SE are stacked between the word lines WL and the bit lines BL.

The resistance change memory elements RE have a high-resistance state and a low-resistance state in which they have lower resistance than in the high-resistance state, and one of the high-resistance state and the low-resistance state is selectively set in accordance with a write voltage (or a write current). That is, binary information can be stored in the resistance change memory elements RE in accordance with their resistance state. For example, phase change memory (PCM) elements or interfacial phase change memory (iPCM) elements can be used as the resistance change memory elements RE.

For example, 2-terminal selector elements having nonlinear voltage-current characteristics can be used as the selector elements SE. That is, 2-terminal selector elements which are turned on when a voltage applied to the 2-terminal selector elements is greater than a threshold value and are turned off when the voltage applied to the 2-terminal selector elements is smaller than the threshold value can be used as the selector elements SE.

The global word line GWL extends in the second direction (the extension direction of the bit lines BL), and the global bit line GBL extends in the first direction (the extension direction of the word lines WL). That is, the global word line GWL is parallel to the bit lines BL, and the global bit line GBL is parallel to the word lines WL. In the present embodiment, the entire global word line GWL corresponds to a first global word line portion GWL1, which will be described later. In addition, in the present embodiment, the entire global bit line GBL corresponds to a first global bit line portion GBL1, which will be described later.

The word line select transistors WST function as word line select circuits, and each of the word line select transistors WST is connected between a corresponding word line WL and the global word line GWL. As shown in FIG. 2, the word line select transistors WST are provided in a surface region of a semiconductor substrate SUB, and one terminal of the source and the drain of each of the word line select transistors WST is connected to a corresponding word line WL via a line (a plug, etc.), and the other terminal of the source and the drain is connected to the global word line GWL via a line (a plug, etc.). In addition, a control signal for selecting (turning on) the word line select transistors WST is input to the gates of the word line select transistors WST.

The bit line select transistors BST function as bit line select circuits, and each of the bit line select transistors BST is connected between a corresponding bit line BL and the global bit line GBL. As shown in FIG. 3, the bit line select transistors BST are provided in the surface region of the semiconductor substrate SUB, and one terminal of the source and the drain of each of the bit line select transistors BST is connected to a corresponding bit line BL via a line (a plug, etc.), and the other terminal of the source and the drain is connected to the global bit line GBL via a line (a plug, etc.). In addition, a control signal for selecting (turning on) the bit line select transistors BST is input to the gates of the bit line select transistors BST.

The word line driver WLD is connected to the global word line GWL, and supplies a selected word line signal to a word line WL selected by a word line select transistor WST. The bit line driver BLD is connected to the global bit line GBL, and supplies a selected bit line signal to a bit line BL selected by a bit line select transistor BST.

In the above-described nonvolatile memory device, when a desired memory cell MC is selected and a write or a read is executed to or from the selected desired memory cell MC, a word line select transistor WST connected to the desired memory cell MC via a word line WL is selected (turned on), and a bit line select transistor BST connected to the desired memory cell MC via a bit line BL is selected (turned on). Then, a selected word line signal (for example, a selected voltage "+VSEL") is supplied to the selected desired memory cell MC from the word line driver WLD via the global word line GWL, the selected word line select transistor WST, and the selected word line WL. Similarly, a selected bit line signal (for example, a selected voltage "−VSEL") is supplied to the selected desired memory cell MC from the bit line driver BLD via the global bit line GBL, the selected bit line select transistor BST, and the selected bit line BL.

In the present embodiment, the global word line GWL has a line width and a line thickness equal to the line width and the line thickness of the bit lines BL. That is, the cross-sectional area of the global word line GWL is equal to the cross-sectional area of the bit lines BL. Moreover, the global word line GWL and the bit lines BL are formed of the same material. Thus, the resistance per unit length of the global word line GWL and the resistance per unit length of the bit lines BL are equal to each other. In addition, as shown in FIG. 2, the global word line GWL and the bit lines BL are provided in the same layer, and are formed by the same manufacturing process.

Moreover, in the present embodiment, the global bit line GBL has a line width and a line thickness equal to the line width and the line thickness of the word lines WL. That is, the cross-sectional area of the global bit line GBL is equal to the cross-sectional area of the word lines WL. In addition, the global bit line GBL and the word lines WL are formed of the same material. Thus, the resistance per unit length of the global bit line GBL and the resistance per unit length of the word lines WL are equal to each other. In addition, as shown in FIG. 3, the global bit line GBL and the word lines WL are provided in the same layer, and are formed by the same manufacturing process.

Moreover, in the present embodiment, an end portion (a first end portion EP1 to which a signal from the word line driver WLD is input) of the global word line GWL and an end portion (a second end portion EP2 to which a signal from the bit line driver BLD is input) of the global bit line GBL are provided at diagonal positions of a memory cell region where the memory cells MC are arranged.

More generally, a word line (the word line WL0) which is the nearest to the first end portion EP1 is a word line which is the farthest from the second end portion EP2, and a word line (the word line WL3) which is the farthest from the first end portion EP1 is a word line which is the nearest to the second end portion EP2. Similarly, a bit line (the bit line BL3) which is the nearest to the second end portion EP2 is a bit line which is the farthest from the first end portion EP1, and a bit line (the bit line BL0) which is the farthest from the second end portion EP2 is a bit line which is the nearest to the first end portion EP1.

In the present embodiment, by virtue of the above-described structure, a voltage which does not depend on the positions of the memory cells can be applied to a selected memory cell MC, when a write or a read is executed to or from the selected memory cell MC. An additional explanation will be given hereinafter.

As is understood from FIG. 1, the path length of a current path from the first end portion EP1 to the second end portion EP2 via a selected memory cell MC is the same, regardless of the position of the selected memory cell MC. However, in an ordinary nonvolatile memory device, a global word line GWL and a global bit line GBL are generally thicker than word lines WL and bit lines BL. That is, the resistance per unit length of the global word line GWL and the resistance per unit length of the global bit line GBL are lower than the resistance per unit length of the word lines WL and the resistance per unit length of the bit lines BL. Thus, the resistance value of a current path from a first end portion EP1 to a second end portion EP2 changes according to the position of a selected memory cell MC.

That is, in the current path, a path portion of the bit lines BL is short when a path portion of the global word line GWL is long, and the path portion of the bit lines BL is long when the path portion of the global word line GWL is short. Similarly, in the current path, a path portion of the word lines WL is short when a path portion of the global bit line GBL is long, and the path portion of the word lines WL is long when the path portion of the global bit line GBL is short. The length of each path portion is determined according to the position of the selected memory cell MC.

Accordingly, although the path length of the current path from the first end portion EP1 to the second end portion EP2 is the same, regardless of the position of the selected memory cell MC, the resistance value of the current path from the first end portion EP1 to the second end portion EP2 changes according to the position of the selected memory cell MC in the ordinary nonvolatile memory device. As a result, a voltage applied to the selected memory cell MC changes according to a voltage drop at each path portion of the global word line GWL, the word lines WL, the bit lines BL, and the global bit line GBL.

In the present embodiment, the resistance value per unit length of the global word line GWL and the resistance value per unit length of the bit lines BL can be made equal to each other, and the resistance value per unit length of the global bit line GBL and the resistance value per unit length of the word lines WL can be made equal to each other. Thus, regardless of the position of the selected memory cell MC, the resistance values of line portions of the current path from the first end portion EP1 to the second end portion EP2 can be equalized. That is, in the present embodiment, a resistance value obtained by subtracting the resistance value of the selected memory cell MC from the total resistance value of the current path from the first end portion EP1 to the second end portion EP2 via the selected memory cell MC can be made substantially the same, whichever memory cell MC is selected. As a result, the above-described problem can be prevented, and a voltage applied to the selected memory cell MC can be made the same, regardless of the positions of the memory cells. Thus, proper write and read operations can be performed for the selected memory cell MC.

In addition, in the present embodiment, since the global word line GWL and the bit lines BL are provided in the same layer, the global word line GWL and the bit lines BL can be formed by a common manufacturing process. Similarly, since the global bit line GBL and the word lines WL are provided in the same layer, the global bit line GBL and the word lines WL can be formed by a common manufacturing process. Thus, the nonvolatile memory device having the above-described characteristics can easily be formed.

Various modified examples of the present embodiment will be described next.

Figure 4:
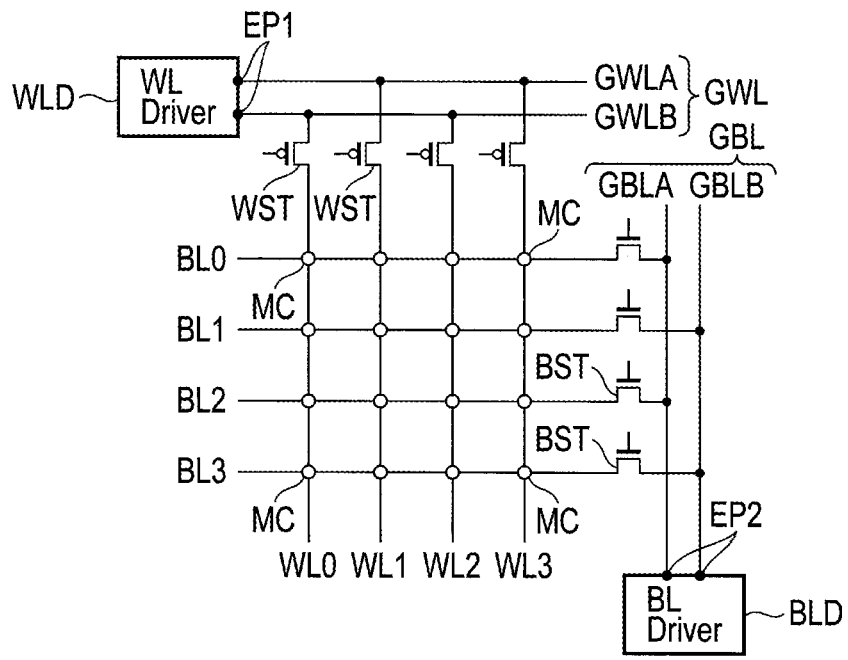
FIG. 4 is an explanation diagram schematically showing the structure of a first modified example of the nonvolatile memory device according to the embodiment.

FIG. 4 is an explanation diagram schematically showing the structure of a first modified example of the nonvolatile memory device according to the present embodiment. Since the basic matters are the same as those of the above-described embodiment, an explanation of the matters explained in the above-described embodiment will be omitted.

In the above-described embodiment, the global word line GWL is constituted of a single line portion extending in a direction parallel to the extension direction of the bit lines BL, and the global bit line GBL is constituted of a single line portion extending in a direction parallel to the extension direction of the word lines WL. In the present modified example, the global word line GWL is constituted of sub-line portions (two sub-line portions GWLA and GWLB in the example of FIG. 4) extending in the direction parallel to the extension direction of the bit lines BL, and the global bit line GBL is constituted of sub-line portions (two sub-line portions GBLA and GBLB in the example of FIG. 4) extending in the direction parallel to the extension direction of the word lines WL. The word line select transistors WST are alternately connected to the sub-line portions GWLA and GWLB, and the bit line select transistors BST are alternately connected to the sub-line portions GBLA and GBLB. The above portions which are referred to as sub-line portions may be lines which are electrically separated from each other, and may be driven separately. For example, only a sub-line portion connected to a selected word line may be driven in accordance with a selected address.

Also in the present modified example, as in the case of the above-described embodiment, the respective resistance values per unit length of the sub-line portions GWLA and GWLB of the global word line GWL and the resistance value per unit length of the bit lines BL can be made equal to each other, and the respective resistance values per unit length of the sub-line portions GBLA and GBLB of the global bit line GBL and the resistance value per unit length of the word lines WL can be made equal to each other, so that the same advantages as those of the above-described embodiment can be obtained.

In the drawing, there is a little path difference between a path from the sub-line portion GWLA to the word line select transistors WST and a path from the sub-line portion GWLB to the word line select transistors WST, but this path difference has substantially almost no influence. Similarly, in the drawing, there is a little path difference between a path from the sub-line portion GBLA to the bit line select transistors BST and a path from the sub-line portion GBLB to the bit line select transistors BST, but this path difference has substantially almost no influence.

In addition, in the present modified example, the global word line GWL is constituted of sub-line portions (the sub-line portions GWLA and GWLB), and the global bit line GBL is constituted of sub-line portions (the sub-line portions GBLA and GBLB). Thus, the current path can be changed according to a selected memory cell MC, and the reliability of the global word line GWL and the global bit line GBL can be improved.

Figure 5:
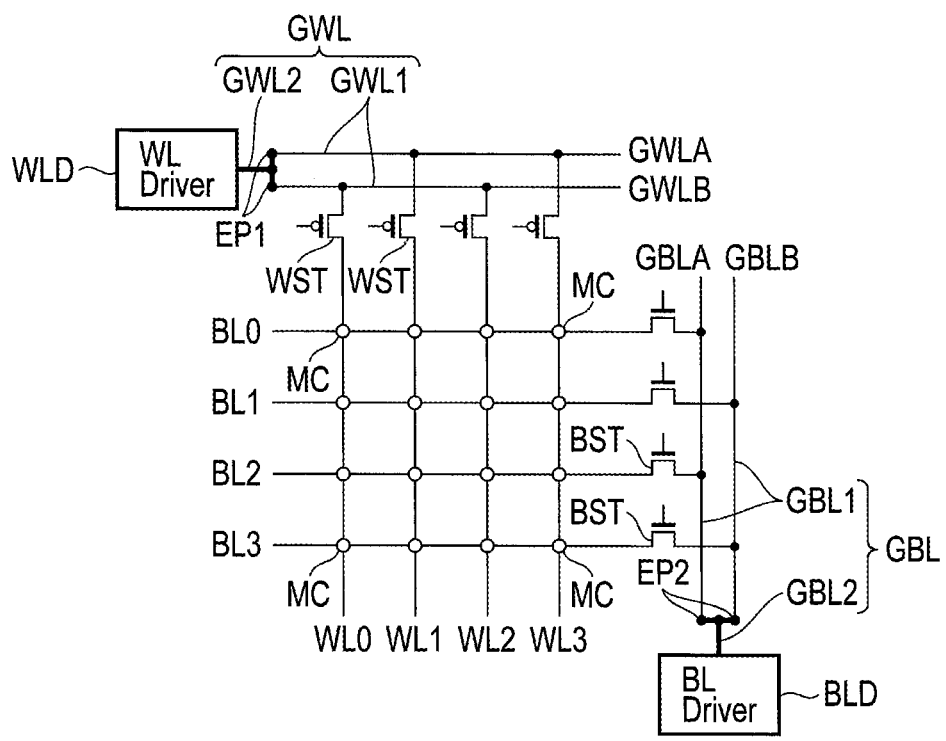
FIG. 5 is an explanation diagram schematically showing the structure of a second modified example of the nonvolatile memory device according to the embodiment.

FIG. 5 is an explanation diagram schematically showing the structure of a second modified example of the nonvolatile memory device according to the present embodiment. Since the basic matters are the same as those of the above-described embodiment and first modified example, an explanation of the matters explained in the above-described embodiment and first modified example will be omitted.

Also in the present modified example, as in the case of the above-described first modified example, the global word line GWL is constituted of sub-line portions (the two sub-line portions GWLA and GWLB in the example of FIG. 5) extending in the direction parallel to the extension direction of the bit lines BL, and the global bit line GBL is constituted of sub-line portions (the two sub-line portions GBLA and GBLB in the example of FIG. 5) extending in the direction parallel to the extension direction of the word lines WL. The word line select transistors WST are alternately connected to the sub-line portions GWLA and GWLB, and the bit line select transistors BST are alternately connected to the sub-line portions GBLA and GBLB.

In the present modified example, the global word line GWL includes the first global word line portion GWL1 having a line width and a line thickness equal to the line width and the line thickness of the bit lines BL, and a second global word line portion GWL2 having a line width greater than the line width of the first global word line portion GWL1. That is, the entire global word line GWL corresponds to the first global word line portion GWL1 in the above-described embodiment and first modified example, whereas the global word line GWL includes the first global word line portion GWL1 and the second global word line portion GWL2 in the present modified example. The resistance per unit length of the second global word line portion GWL2 is sufficiently smaller than the resistance per unit length of the first global word line portion GWL1. Thus, the resistance value of the global word line GWL is substantially defined by the resistance value of the first global word line portion GWL1.

As described above, the first global word line portion GWL1 has a line width and a line thickness equal to the line width and the line thickness of the bit lines BL. In addition, the first global word line portion GWL1 basically has the same characteristics as those of the global word line GWL described in the above-described embodiment. That is, the first global word line portion GWL1 and the bit lines BL are formed of the same material, and the resistance per unit length of the first global word line portion GWL1 and the resistance per unit length of the bit lines BL are equal to each other. In addition, as in the case of the structure shown in FIG. 2, the first global word line portion GWL1 and the bit lines BL are provided in the same layer, and are formed by the same manufacturing process.

Moreover, in the present modified example, the global bit line GBL includes the first global bit line portion GBL1 having a line width and a line thickness equal to the line width and the line thickness of the word lines WL, and a second global bit line portion GBL2 having a line width greater than the line width of the first global bit line portion GBL1. That is, the entire global bit line GBL corresponds to the first global bit line portion GBL1 in the above-described embodiment and the first modified example, whereas the global bit line GBL includes the first global bit line portion GBL1 and the second global bit line portion GBL2 in the present modified example. The resistance per unit length of the second global bit line portion GBL2 is sufficiently smaller than the resistance per unit length of the first global bit line portion GBL1. Thus, the resistance value of the global bit line GBL is substantially defined by the resistance value of the first global bit line portion GBL1.

As described above, the first global bit line portion GBL1 has a line width and a line thickness equal to the line width and the line thickness of the word lines WL. In addition, the first global bit line portion GBL1 basically has the same characteristics as those of the global bit line GBL described in the above-described embodiment. That is, the first global bit line portion GBL1 and the word lines WL are formed of the same material, and the resistance per unit length of the first global bit line portion GBL1 and the resistance per unit length of the word lines WL are equal to each other. In addition, as in the case of the structure shown in FIG. 3, the first global bit line portion GBL1 and the word lines WL are provided in the same layer, and are formed by the same manufacturing process.

Moreover, in the present modified example, a connection portion between the first global word line portion GWL1 and the second global word line portion GWL2 corresponds to the first end portion EP1 (an end portion of the first global word line portion GWL1 to which a signal from the word line driver WLD is input), and a connection portion between the first global bit line portion GBL1 and the second global bit line portion GBL2 corresponds to the second end portion EP2 (an end portion of the first global bit line portion GBL1 to which a signal from the bit line driver BLD is input). Furthermore, the first end portion EP1 and the second end portion EP2 are provided at diagonal positions of the memory cell region where the memory cells MC are arranged.

More generally, a word line (the word line WL0) which is the nearest to the first end portion EP1 is a word line which is the farthest from the second end portion EP2, and a word line (the word line WL3) which is the farthest from the first end portion EP1 is a word line which is the nearest to the second end portion EP2. Similarly, a bit line (the bit line BL3) which is the nearest to the second end portion EP2 is a bit line which is the farthest from the first end portion EP1, and a bit line (the bit line BL0) which is the farthest from the second end portion EP2 is a bit line which is the nearest to the first end portion EP1.

As described above, in the present modified example, the first global word line portion GWL1 basically has the same characteristics as those of the global word line GWL described in the above-described embodiment, and the first global bit line portion GBL1 basically has the same characteristics as those of the global bit line GBL described in the above-described embodiment. Thus, also in the present modified example, as in the case of the above-described embodiment, the resistance value per unit length of the first global word line portion GWL1 and the resistance value per unit length of the bit lines BL can be made equal to each other, and the resistance value per unit length of the first global bit line portion GBL1 and the resistance value per unit length of the word lines WL can be made equal to each other, so that the same advantages as those of the above-described embodiment can be obtained.

In addition, also in the present modified example, as in the case of the first modified example, the global word line GWL includes sub-line portions (the sub-line portions GWLA and GWLB), and the global bit line GBL includes sub-line portions (the sub-line portions GBLA and GBLB). Thus, the current path can be changed according to a selected memory cell MC, and the reliability of the global word line GWL and the global bit line GBL can be improved.

Figure 6:
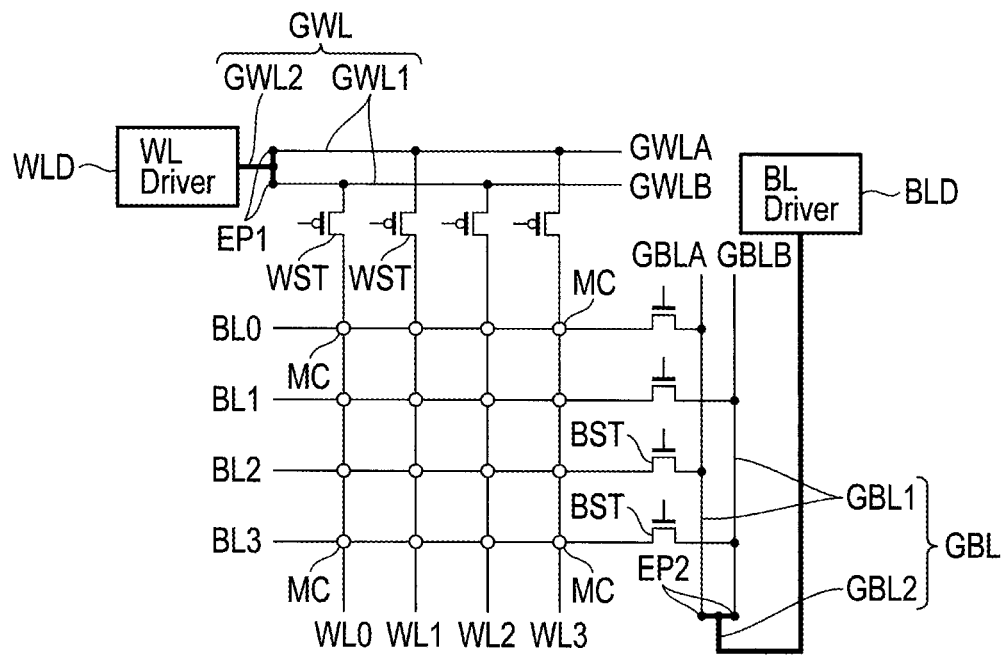
FIG. 6 is an explanation diagram schematically showing the structure of a third modified example of the nonvolatile memory device according to the embodiment.
Figure 7:
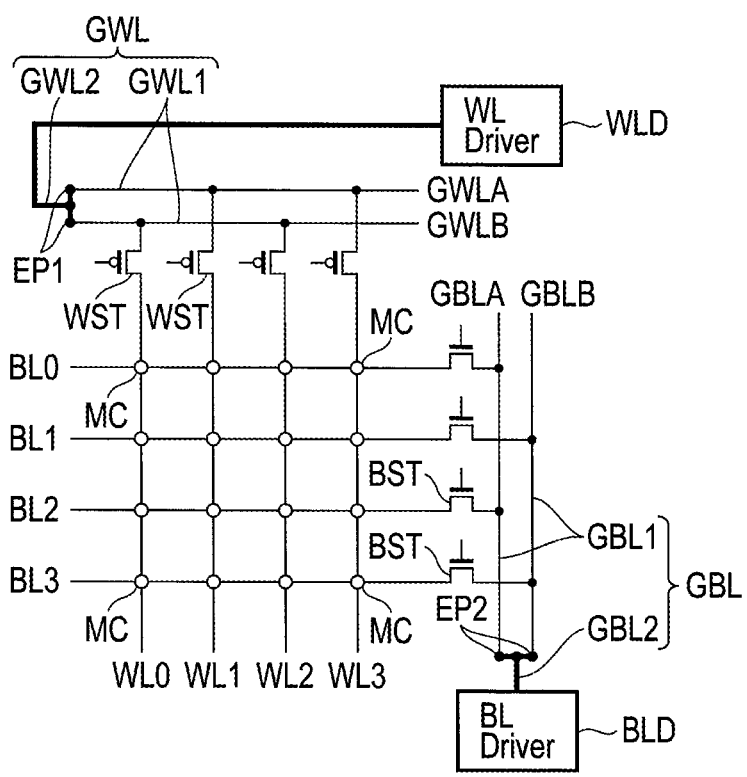
FIG. 7 is an explanation diagram schematically showing the structure of a fourth modified example of the nonvolatile memory device according to the embodiment.

FIG. 6, FIG. 7, and FIG. 8 are explanation diagrams schematically showing the structures of third, fourth, and fifth modified examples of the nonvolatile memory device according to the present embodiment, respectively. Since the basic matters are the same as those of the above-described embodiment, first modified example, and second modified example, an explanation of the matters explained in the above-described embodiment, first modified example, and second modified example will be omitted.

The third, fourth, and fifth modified examples also have the same basic structure as that of the above-described second modified example. It should be noted that in the third, fourth, and fifth modified examples, the word line driver WLD and the bit line driver BLD are not provided at diagonal positions of the memory cell region. However, also in the third, fourth, and fifth modified examples, as in the case of the second modified example, the first end portion EP1 of the first global word line portion GWL1 and the second end portion EP2 of the first global bit line portion GBL1 are provided at diagonal positions of the memory cell region. Accordingly, also in the third, fourth, and fifth modified examples, the same advantages as those of the above-described embodiment, first modified example, and second modified example can be obtained.

FIG. 9 is an explanation diagram schematically showing the structure of a sixth modified example of the nonvolatile memory device according to the present embodiment. Since the basic matters are the same as those of the above-described embodiment, first modified example, and second modified example, an explanation of the matters explained in the above-described embodiment, first modified example, and second modified example will be omitted.

The present modified example also has the same basic structure as that of the above-described second modified example. It should be noted that in the present modified example, sub-line portions GWLA, GWLB, GWLC, and GWLD of the global word line GWL, which correspond to the word lines WL0, WL1, WL2, and WL3, respectively, are provided, and sub-line portions GBLA, GBLB, GBLC, and GBLD of the global bit line GBL, which correspond to the bit lines BL0, BL1, BL2, and BL3, respectively, are provided.

Also in the present modified example, the same advantages as those described in the above-described embodiment, first modified example, and second modified example can be obtained.

FIG. 10 is an explanation diagram schematically showing the structure of a seventh modified example of the nonvolatile memory device according to the present embodiment. Since the basic matters are the same as those of the above-described embodiment, first modified example, and second modified example, an explanation of the matters explained in the above-described embodiment, first modified example, and second modified example will be omitted.

In the present modified example, word line sub-select transistors (word line sub-select circuits) WSST and bit line sub-select transistors (bit line sub-select circuits) BSST are provided. Each of the word line sub-select transistors WSST is connected between the global word line GWL and two or more word line select transistors (word line select circuits) WST successively provided in the extension direction of the global word line GWL. Each of the bit line sub-select transistors (bit line sub-select circuits) BSST is connected between the global bit line GBL and two or more bit line select transistors (bit line select circuits) BST successively provided in the extension direction of the global bit line GBL.

As shown in FIG. 10, when a word line sub-select transistor WSST is disposed at a position corresponding to the midpoint between a first word line select transistor WST1 and a second word line select transistor WST2, a path difference ΔRbl corresponding to the length of a bit line portion between memory cells MC adjacent in the direction of the bit lines BL arises between a path from the first end portion EP1 to the second end portion EP2 via the first word line select transistor WST1, and a path from the first end portion EP1 to the second end portion EP2 via the second word line select transistor WST2.

Similarly, when a bit line sub-select transistor BSST is disposed at a position corresponding to the midpoint between a first bit line select transistor BST1 and a second bit line select transistor BST2, a path difference ΔRwl corresponding to the length of a word line portion between memory cells MC adjacent in the direction of the word lines WL arises between a path from the second end portion EP2 to the first end portion EP1 via the first bit line select transistor BST1 and a path from the second end portion EP2 to the first end portion EP1 via the second bit line select transistor BST2.

However, since the distance between adjacent memory cells MC is short, a difference in voltage drop due to the path difference ΔRbl and a difference in voltage drop due to the path difference ΔRwl are both small. Accordingly, also in a case where the word line sub-select transistors WSST and the bit line sub-select transistors BSST are provided as in the present modified example, the same advantages as those described in the above-described embodiment, first modified example, and second modified example can be obtained.

FIG. 11 is an explanation diagram schematically showing the structure of an eighth modified example of the nonvolatile memory device according to the present embodiment. Since the basic matters are the same as those of the above-described embodiment, first modified example, second modified example, and seventh modified example, an explanation of the matters explained in the above-described embodiment, first modified example, second modified example, and seventh modified example will be omitted.

Also in the present modified example, as in the case of the above-described seventh modified example, the word line sub-select transistors (word line sub-select circuits) WSST and the bit line sub-select transistors (bit line sub-select circuits) BSST are provided.

It should be noted that in the present modified example, the positions of the word line sub-select transistors WSST and the bit line sub-select transistors BSST differ from the seventh modified example in order to prevent the problem of the path differences ΔRbl and ΔRwl of the above-described seventh modified example from arising.

In the following description, a memory cell which is the nearest to the first word line select transistor (first word line select circuit) WST1 is defined as a first memory cell MC1A, and a memory cell which is the nearest to the second word line select transistor (second word line select circuit) WST2 is defined as a second memory cell MC2A. In addition, a path between a word line sub-select transistor (word line sub-select circuit) WSST and the first word line select transistor WST1 is defined as a first path P1A, and a path between the word line sub-select transistor WSST and the second word line select transistor WST2 is defined as a second path P2A.

In the present modified example, the second path P2A is longer than the first path P1A, and the path difference ΔRbl between the second path P2A and the first path P1A corresponds to the length of a bit line portion between the first memory cell MC1A and the second memory cell MC2A. In addition, a path portion which makes the above path difference ΔRbl of the second path P2A is a portion parallel to the bit lines BL, and has a line width and a line thickness equal to the line width and the line thickness of the bit lines BL.

Moreover, as in the case of the above first memory cell MC1A and second memory cell MC2A, a memory cell which is the nearest to the first bit line select transistor (first bit line select circuit) BST1 is defined as a first memory cell MC1B, and a memory cell which is the nearest to the second bit line select transistor (second bit line select circuit) BST2 is defined as a second memory cell MC2B. In addition, a path between a bit line sub-select transistor (bit line sub-select circuit) BSST and the first bit line select transistor BST1 is defined as a first path P1B, and a path between the bit line sub-select transistor BSST and the second bit line select transistor BST2 is defined as a second path P2B.

In the present modified example, the second path P2B is longer than the first path P1B, the path difference ΔRwl between the second path P2B and the first path P1B corresponds to the length of a word line portion between the first memory cell MC1B and the second memory cell MC2B. In addition, a path portion which makes the above path difference ΔRwl of the second path P2B is a portion parallel to the word lines WL, and has a line width and a line thickness equal to the line width and the line thickness of the word lines WL.

In the present modified example, the path differences of the seventh modified example can be eliminated by adopting the above-described structure. Thus, the path length from the first end portion EP1 to the second end portion EP2 can be made the same regardless of the position of a selected memory cell MC. Accordingly, also in the present modified example, the same advantages as those described in the above-described embodiment, first modified example, and second modified example can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
a first word line extending in a first direction;
a second word line extending in the first direction;
a first bit line extending in a second direction intersecting the first direction;
a second bit line extending in the second direction;
memory cells connected between the first word line and the first bit line, between the first word line and the second bit line, between the second word line and the first bit line, and between the second word line and the second bit line, respectively, and each including a resistance change memory element;
a global word line extending in the second direction;
a global bit line extending in the first direction;
a first word line select circuit connected between the first word line and the global word line;
a second word line select circuit connected between the second word line and the global word line;
a first bit line select circuit connected between the first bit line and the global bit line;
a second bit line select circuit connected between the second bit line and the global bit line;
a word line driver connected to the global word line, and supplying a first signal to the first word line selected by the first word line select circuit and to the second word line selected by the second word line select circuit; and
a bit line driver connected to the global bit line, and supplying a second signal to the first bit line selected by the first bit line select circuit and to the second bit line selected by the second bit line select circuit,
wherein the first word line and the second word line both have a first line width and a first line thickness,
the first bit line and the second bit line both have a second line width and a second line thickness,
the global word line includes a first global word line portion having the second line width and the second line thickness,
the global bit line includes a first global bit line portion having the first line width and the first line thickness,
the first global word line portion has a first end portion to which a signal from the word line driver is input,
the first global bit line portion has a second end portion to which a signal from the bit line driver is input, and
the first word line is nearer than the second word line with respect to the first end portion, the second word line is nearer than the first word line with respect to the second end portion, the first bit line is nearer than the second bit line with respect to the first end portion, and the second bit line is nearer than the first bit line with respect to the second end portion.

2. The device of claim 1, wherein the first global word line portion, the first bit line, and the second bit line are formed of a same material, and
the first global bit line portion, the first word line, and the second word line are formed of a same material.

3. The device of claim 1, wherein the first global bit line portion, the first word line, and the second word line each have a first cross-sectional area, and
the first global word line portion, the first bit line, and the second bit line each have a second cross-sectional area.

4. The device of claim 1, wherein the first global word line portion, the first bit line, and the second bit line are provided in a same layer, and
the first global bit line portion, the first word line, and the second word line are provided in a same layer.

5. The device of claim 1, wherein a position of the first end portion and a position of the second end portion correspond to diagonal positions of a region where the memory cells are provided.

6. The device of claim 1, wherein the global word line further includes a second global word line portion which is greater in line width than the first global word line portion, and a connection portion between the first global word line portion and the second global word line portion corresponds to the first end portion, and
the global bit line further includes a second global bit line portion which is greater in line width than the first global bit line portion, and a connection portion between the first global bit line portion and the second global bit line portion corresponds to the second end portion.

7. The device of claim 1, wherein the first global word line portion is constituted of a single line portion extending in the second direction, and
the first global bit line portion is constituted of a single line portion extending in the first direction.

8. The device of claim 1, wherein the first global word line portion is constituted of sub-line portions each extending in the second direction, and
the first global bit line portion is constituted of sub-line portions each extending in the first direction.

9. The device of claim 1, wherein a resistance value obtained by subtracting a resistance value of a selected memory cell from a total resistance value of a current path from the first end portion to the second end portion via the selected memory cell is substantially same, whichever memory cell is selected.

10. The device of claim 1, wherein the first word line select circuit and the second word line select circuit are both constituted of a single transistor, and
the first bit line select circuit and the second bit line select circuit are both constituted of a single transistor.

11. The device of claim 1, further comprising:
a word line sub-select circuit connected between the global word line and the first and second word line select circuits; and
a bit line sub-select circuit connected between the global bit line and the first and second bit line select circuits.

12. The device of claim 11, wherein one of the memory cells which is nearest to the first word line select circuit is defined as a first memory cell, and one of the memory cells which is nearest to the second word line select circuit is defined as a second memory cell,
a path between the word line sub-select circuit and the first word line select circuit is defined as a first path, and a path between the word line sub-select circuit and the second word line select circuit is defined as a second path,
the second path is longer than the first path, and a path difference between the second path and the first path corresponds to a length of a bit line portion between the first memory cell and the second memory cell, and
the second path includes a path portion which is parallel to the second direction, which has a length corresponding to the path difference, and which has the second line width and the second line thickness.

13. The device of claim 11, wherein one of the memory cells which is nearest to the first bit line select circuit is defined as a first memory cell, and one of the memory cells which is nearest to the second bit line select circuit is defined as a second memory cell,
a path between the bit line sub-select circuit and the first bit line select circuit is defined as a first path, and a path between the bit line sub-select circuit and the second bit line select circuit is defined as a second path,
the second path is longer than the first path, a path difference between the second path and the first path corresponds to a length of a word line portion between the first memory cell and the second memory cell, and
the second path includes a path portion which is parallel to the first direction, which has a length corresponding to the path difference, and which has the first line width and the first line thickness.

14. The device of claim 1, wherein each of the memory cells further includes a selector element connected to the resistance change memory element in series.

* * * * *